(12) United States Patent
Takahashi et al.

(10) Patent No.: US 6,603,328 B2
(45) Date of Patent: Aug. 5, 2003

(54) SEMICONDUCTOR INTEGRATED CIRCUIT

(75) Inventors: Hiroshi Takahashi, Tsukuba (JP);
Osamu Handa, Tokyo (JP); Akihiro Takegama, Tsukuba (JP); Yutaka Toyonoh, Toride (JP); Kaoru Awaka, Tsukuba (JP); Rimon Ikeno, Tsukuba (JP); Tsuyoshi Tanaka, Tsuchiura (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/974,696

(22) Filed: Oct. 10, 2001

(65) Prior Publication Data

US 2003/0067318 A1 Apr. 10, 2003

(30) Foreign Application Priority Data

Oct. 10, 2000 (JP) ........................................ 2000-309574

(51) Int. Cl.$^7$ ............................................... G01R 31/26
(52) U.S. Cl. ..................... 324/765; 324/158.1; 324/769
(58) Field of Search ............................. 324/765, 158.1, 324/769, 768, 763; 327/281, 544, 535

(56) References Cited

U.S. PATENT DOCUMENTS 4,825,106 A * 4/1989 Tipon et al. ................. 326/121
4,839,865 A * 6/1989 Sato et al. ................... 365/201
6,411,149 B1 * 6/2002 Ooishi ......................... 327/281
6,459,301 B2 * 10/2002 Hidaka ......................... 326/83

\* cited by examiner

Primary Examiner—Kamand Cuneo
Assistant Examiner—Tung X. Nguyen
(74) Attorney, Agent, or Firm—William B. Kempler; W. James Brady, III; Frederick J. Telecky, Jr.

(57) ABSTRACT

The objective of this invention is to provide a type of semiconductor integrated circuit which can lessen solution in the circuit area to the minimum necessary level, and can lessen the leakage current in the standby state so as to cut the power consumption, and which allows $I_{ddq}$ test to determine whether it is passed or defective. Logic circuit 10 composed of low threshold voltage transistors and switching circuit 20 composed of transistors having the standard threshold voltage are set. In the operation, the switching circuit is turned ON, and a driving current is fed to logic circuit 10. On the other hand, in the standby mode, the switching circuit is turned OFF, and the path of the leakage current is cut off to lessen generation of the leakage current. In the case of $I_{ddq}$ test, different bulk bias voltages are applied to the channel regions of PMOS transistors and NMOS transistors from an IC tester through pads P1 and P2. In this way, the leakage current can be lessened on a low level, and whether the semiconductor integrated circuit is passed or defective can be judged from the results of the current measurement.

12 Claims, 7 Drawing Sheets

SEMICONDUCTOR INTEGRATED CIRCUIT

FIELD OF THE INVENTION

This invention pertains to a type of semiconductor integrated circuit that contains a functional circuit made of CMOS transistors, such as a logic circuit for performing the prescribed logic operation. In particular, this invention pertains to a type of semiconductor integrated circuit that can be determined to be defective or not by means of the $I_{ddq}$ test.

BACKGROUND OF THE INVENTION

For a low threshold voltage transistor that is formed with a threshold voltage lower than the conventional voltage node, its leakage current is nevertheless larger than that of the conventional transistor although it is appropriate for performing the low voltage operation. Consequently, power consumption in the standby mode is a problem. In the prior art, various systems have been proposed in order to solve this problem. Among them, there is the system that makes use of the multi-threshold voltage CMOS (MT-CMOS) transistor which has two or more types of transistors having different threshold voltages corresponding to the operation requests.

In this system, the circuit portion that is required to perform high speed operation is composed of transistors having a low threshold voltage, and a transistor with a high threshold voltage is set as a switching transistor for lessening the generation of the leakage current in the standby mode. On the other hand, the circuit portion that is required to perform the operation at the normal operation speed is composed of transistors having the normal threshold voltage, and it is possible to minimize the leakage current in the standby mode without using a transistor for switching. Consequently, this multi-threshold voltage system is an effective technology for the semiconductor integrated circuit that can operate at a low power source voltage and can realize high speed operation and low power consumption at a low voltage.

However, for the aforementioned conventional multi-threshold voltage system, the $I_{ddq}$ test method has not been established. For the manufactured semiconductor integrated circuits, it is necessary to perform the test individually. Consequently, it is hard to use this system for mass production.

In order to solve this problem, a technology has been proposed to enable embodiment of the $I_{ddq}$ test by means of the multi-threshold voltage transistor and by exploiting the bulk bias effect of the transistor.

However, in this technology, it is necessary to generate the bulk voltages for PMOS transistors and NMOS transistors, respectively. In order to generate these voltages, it is necessary to form a dedicated voltage generating circuit, such as a booster circuit, on the chip. In order to lessen the leakage current in the standby mode, even in the standby state, it is necessary to have the booster circuit operate so that the bulk bias voltage is kept being fed. As a result, not only the layout area of the semiconductor integrated circuit is increased, but also the power consumption due to the booster circuit in the standby mode becomes a problem.

The purpose of this invention is to solve the aforementioned problems of the conventional methods by providing a type of semiconductor integrated circuit which can lessen the increase in the circuit area to the necessary minimum level and can lessen the leakage current in the standby mode, and which does not need the reliability test, such as the test, etc., when $I_{ddq}$ test is performed to determine whether it is defective or not.

SUMMARY OF INVENTION

In accordance with one aspect of this invention provides a type of semiconductor integrated circuit characterized by the following facts: the semiconductor integrated circuit has a functional circuit, which has a transistor of the first electroconductive type and a transistor of the second electroconductive type having low threshold voltages and connected between a first voltage node and a second voltage node, and which performs the prescribed signal processing with respect to the input signal, and a switching circuit, which has a transistor having the normal threshold voltage and connected between a first power source voltage feeding terminal and said first voltage node or between said second voltage node and a second power source voltage feeding terminal, and which feeds the driving current selectively with respect to said functional circuit; in normal operation, said first power source voltage and second power source voltage are applied to the channel region of said transistor of the first electroconductive type and said transistor of the second electroconductive type, respectively; in the test operation, a first bias voltage higher than the first power source voltage and a second bias voltage lower than the second power source voltage are applied to the channel region of said transistor of the first electroconductive type and said channel region of said transistor of the second electroconductive type, respectively.

Also, in a preferable scheme of this invention, it has a bias voltage application means which applies said first bias voltage and said second bias voltage or the first power source voltage and the second power source voltage on said wiring for the first bias voltage and said wiring for the second bias voltage, respectively.

Also, in a preferable scheme of this invention, it has a bias voltage application means which applies said first bias voltage and said second bias voltage or the first power source voltage and the second power source voltage to said wiring for the first bias voltage and said wiring for the second bias voltage, respectively.

Also, the channel region of the transistor that forms said switching circuit is connected to the channel region of said transistor of the first electroconductive type or the channel region of said transistor of the second electroconductive type.

Also, said first bias voltage and said second bias voltage are fed from an IC tester or other peripheral equipment.

BRIEF DESCRIPTION OF THE DRAWINGS

FIG. 7(a) illustrates voltages applied to wires in the normal operation state. FIG. 7(b) illustrates the layout of a cell composed of low threshold voltage transistors. FIG. 7(c) illustrates the voltage applied in an $I_{ddq}$ test.

FIG. 8(a) illustrates the layout of a conventional ASIC cell. FIGS. 8(b) and 8(c) illustrate an ASIC cell according to the present invention.

REFERENCE NUMERALS AND SYMBOLS AS SHOWN IN THE DRAWINGS

In the figures, 10 represents a logic circuit, 20 a switching circuit, 100 a wiring of power source voltage $V_{dd}$, 110 a wiring of the bulk bias voltage of PMOS transistor, 120 a wiring of virtual ground potential, 130 a wiring of the bulk bias voltage of NMOS transistor, $V_{dd}$ a power source voltage, GND a ground potential

DESCRIPTION OF EMBODIMENTS

FIRST EMBODIMENT

Figure 1:
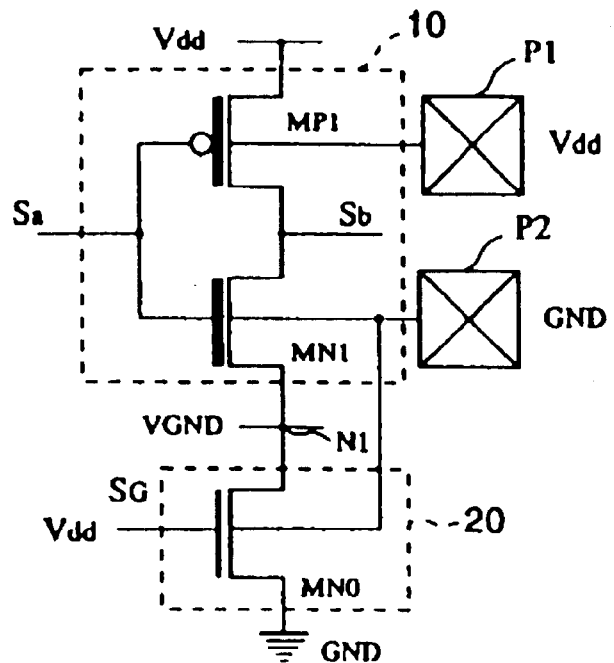
FIG. 1 is a circuit diagram illustrating the first embodiment of the semiconductor integrated circuit in this invention.

FIG. 1 is a circuit diagram illustrating the first embodiment of the semiconductor integrated circuit pertaining to this invention.

As shown in this figure, the semiconductor integrated circuit in this embodiment is composed of logic circuit 10 and switching circuit 20.

Logic circuit 10 is a functional circuit having the prescribed processing function. Logic circuit 10 shown in FIG. 1 is composed of a CMOS inverter which outputs signal Sb that represents the logic inversion value with respect to input signal Sa. However, this invention is not limited to this scheme. It is also possible to be other logic circuits, such as the AND circuit, OR circuit, exclusive-OR (EXOR) circuit, or functional circuits having processing functions other than the logic circuits.

As shown in the figure, logic circuit 10 is composed of PMOS transistor MP1 and NMOS transistor MN1 that are connected in series between the feeding terminal of power source voltage $V_{dd}$ and node N1 as the feeding terminal of the virtual ground potential VGND. These transistors are low threshold voltage transistors having threshold voltages lower than that of conventional transistors. For example, threshold voltage $[V]_{thp}$ of PMOS transistor MP1 may be −0.2 V, and threshold voltage $V_{thn}$ of NMOS transistor MN1 may be 0.2 V.

Since logic circuit 10 is composed of transistors with low threshold voltages, it can maintain the operation speed even when the power source voltage $V_{dd}$ is low. High speed operation can be realized even when power source voltage $V_{dd}$ is on a level near the threshold voltage of the conventional transistors, such as 0.7–1.0 V. However, as the threshold voltages of the transistors that form logic circuit 10 are low, the leakage current is increased and the power consumption is increased in the standby mode.

Switching circuit 20 is set for supplying the necessary operation voltage to logic circuit 10 so as to lessen the leakage current of logic circuit 10 in the standby mode. As shown in the figure, switching circuit 20 is composed of NMOS transistor MN0. The drain of transistor MN0 is connected to node N1, its source is connected to ground potential GND, and control signal $S_g$ is applied to its gate.

Transistor MN0 that forms switching circuit 20 is turned ON or OFF corresponding to control signal $S_G$. When transistor MN0 is turned ON, node N1 is held at ground potential GND, a driving current is fed to logic circuit 10, so that logic circuit 10 is in operation state. On the other hand, the current feeding path of logic circuit 10 is cut when transistor MN0 is OFF, so that logic circuit 10 is kept in the non-operation state (standby state). In the semiconductor integrated circuit of this embodiment, transistor MN0 is turned OFF in the stability state, so that the generation of leakage current in logic circuit 10 is lessened, and the power consumption in the standby state is decreased.

In order to lessen the leakage current for the semiconductor integrated circuit of this embodiment, different bulk bias voltages are applied to the channel regions of the PMOS transistor and the NMOS transistor, respectively. For example, a bulk bias voltage $V_{bp}=(V_{dd}+V_{bsp})$ that is higher than power source voltage $V_{dd}$ is applied to the channel region of PMOS transistor MP1, while a bulk bias voltage $V_{bn}=(GND-V_{bsn})$ that is lower than the ground potential GND is applied to the channel regions of NMOS transistor MN1 and MN0.

Also, the channel regions of PMOS transistors are commonly connected to pad P1, and the channel regions of NMOS transistors are commonly connected to pad P2. During testing, a bulk bias voltage $V_{bp}=(V_{dd}+V_{bsp})$ is applied to the channel regions of PMOS transistors through pad P1, and a bulk bias voltage $V_{bn}=(GND-V_{bsn})$ is applied to the channel regions of NMOS transistors through pad P2. On the other hand, during the operation, voltage $V_{dd}$ that is equal to power source voltage $V_{dd}$ is applied to the channel regions of PMOS transistors through pad P1, and voltage GND that is equal to ground potential GND is applied to the channel regions of NMOS transistors through pad P2. Also, a switching means for switching the voltage may be set between pads P1 and P2.

In the following, the operation states will be explained with reference to the terminal voltages of the semiconductor integrated circuit.
Operation State FIG. 1 is a diagram illustrating the voltages at the various terminals of the semiconductor integrated circuit in the operation state. As shown in the figure, a bulk bias voltage on the level of power source voltage $V_{dd}$ is applied to pad P1 in the operation state, and a bulk bias voltage on the level of ground potential GND is applied to pad P2. That is, in this case, the channel region of PMOS transistor MP1 is biased to power source voltage $V_{dd}$, and the channel region of NMOS transistors MN1 and MN0 is biased to ground potential GND.

In addition, as shown in the figure, as control signal $S_g$ on the level of power source voltage $V_{dd}$ is applied to the gate of transistor MN0 in the operation state, transistor MN0 is turned ON. Consequently, node N1 is nearly kept at ground potential GND, and a driving current is fed to logic circuit 10.

Standby State 1

Figure 2:
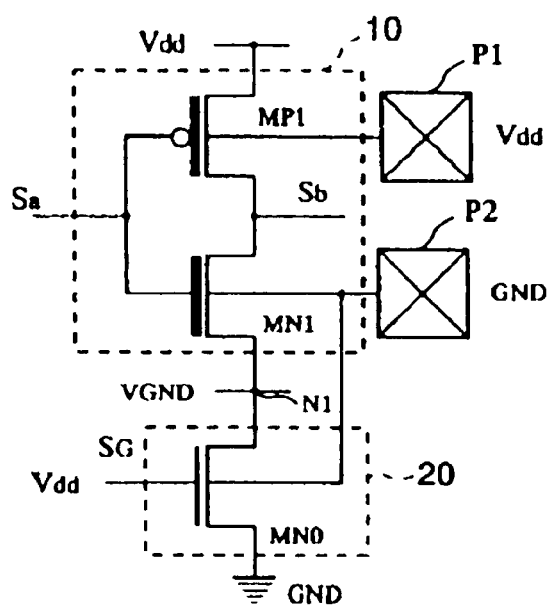
FIG. 2 is a circuit diagram illustrating the bias voltage in standby state 1 of the semiconductor integrated circuit in this embodiment.

FIG. 2 is a diagram illustrating the voltages at the various terminals of the semiconductor integrated circuit in standby state 1. In this state, the bulk bias voltages applied to the PMOS transistors and NMOS transistors are similar to those applied in the aforementioned operation state. Also, in this case, control signal $S_g$ on the level of power source voltage $V_{dd}$ is applied to the gate of transistor MN0. That is, a relatively large leakage current is generated in logic circuit 10 in this state, and the leakage current in the standby state leads to a higher power consumption. However, the time for returning to the normal operation state is short in this standby state 1, so that recovery can be realized at a high speed. Also, the partial circuit made of low threshold voltage transistors is used only in the critical path for the overall semiconductor integrated circuit, while the remaining circuit is composed of transistors having the normal threshold voltage. Consequently, an increase in the power consumption due to an increase in the leakage current in the standby state can be minimized.

Standby State 2

Figure 3:
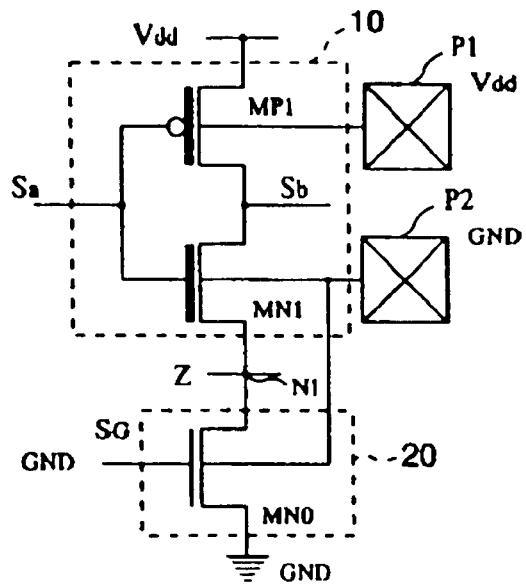
FIG. 3 is a circuit diagram illustrating the bias voltage in standby state 2 of the semiconductor integrated circuit in this embodiment.

FIG. 3 is a diagram illustrating the voltages at the various terminals of the semiconductor integrated circuit in standby state 2. In this state, the bulk bias voltages applied to the PMOS transistors and NMOS transistors are nearly equal to the bulk bias voltages applied in the aforementioned operation state and standby state 1. However, in standby state 2, control signal $S_g$ on the level of ground potential GND is applied to the gate of transistor MN0. Consequently, transistor MN0 is turned OFF.

That is, in standby state 2, transistor MN0 is kept in OFF state corresponding to control signal $S_g$, and the current path of logic circuit 10 is cutoff. Consequently, in standby state 2, the generation of the leakage current of logic circuit 10 is lessened, and the power consumption in the standby state is lower than that in standby state 1. Usually, for DSP or other semiconductor processing devices, when recovery is made from a deep standby state, such as in the case of recovery from the state when even feeding the clock signal is stopped to the operation state, the PLL circuit that generates the clock signal is started from the OFF state. The time for realizing feeding of the necessary clock signal, that is, the time from start of the PLL circuit to the lock state, is usually a few clock cycles. Consequently, logic circuit 10 may be started before the PLL circuit is recovered to the normal operation state. As shown in FIG. 3, this time is sufficient for recovery from standby state 2 to the normal operation state, and there is no problem with respect to the response property of the circuit during recovery from the standby state to the operation state.

$I_{DDQ}$ Test Operation

Figure 4:
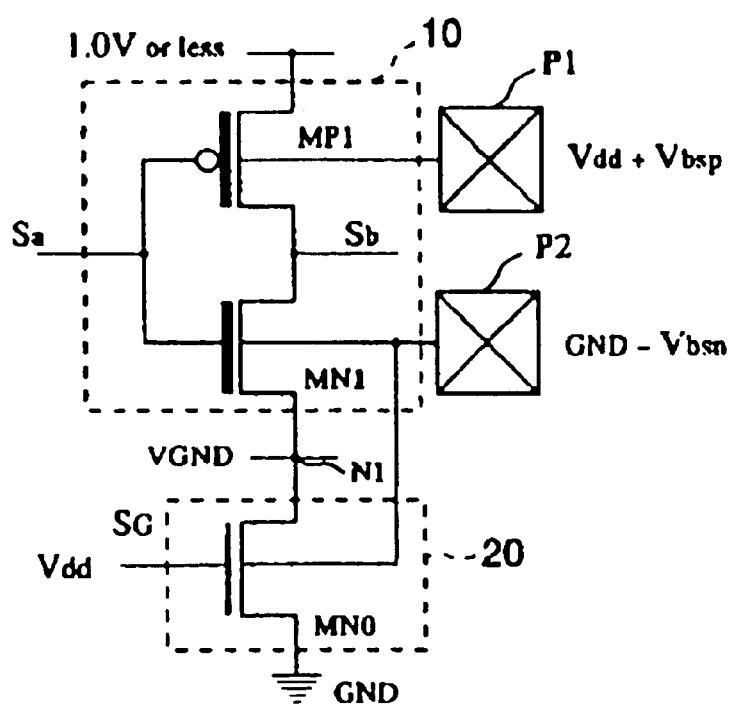
FIG. 4 is a circuit diagram illustrating the bias voltage in the $I_{ddq}$ test of the semiconductor integrated circuit in this embodiment.

FIG. 4 is a diagram illustrating the voltages applied to the various terminals of the semiconductor integrated circuit when $I_{ddq}$ test is performed. As shown in the figure, voltage $V_{bp}=(V_{dd}+V_{bsp})$ that is higher than power source voltage $V_{dd}$ is applied to pad P1, and voltage $V_{bn}=(GND-V_{bsn})$ that is lower than ground potential GND is applied to pad P2. That is, when $I_{ddq}$ test is performed, the channel region of PMOS transistor is biased to voltage $V_{bp}=(V_{dd}+V_{bsp})$ that is higher than power source voltage $V_{dd}$, and the channel region of NMOS transistor is biased to voltage $V_{bn}=(GND-V_{bsn})$ that is lower than ground potential GND. In this case, for example, with respect to power source voltage $V_{dd}$ of 1.2 V, voltage $V_{bsp}$ is 2.6 V, and voltage $V_{bsn}$ is 2.6 V. These voltages $V_{bsp}$, $V_{bsn}$ may be selected at will in a range where the reliability of the gate oxide film is not degraded, and pn junction breakdown does not take place.

Also, as shown in the figure, control signal $S_g$ on the level of power source voltage $V_{dd}$ is applied to the gate of transistor MN0. Consequently, transistor MN0 is turned ON. Consequently, a driving circuit is fed to logic circuit 10, and logic circuit 10 becomes the state that allows operation. As a result, it is possible to perform the so-called delta $I_{ddq}$ test, in which the test vector, power source, and bias voltage are changed, and the change in $I_{ddq}$ is monitored to judge whether the product is defective or not.

In logic circuit 10, a voltage higher than power source voltage $V_{dd}$ is applied to the channel region of PMOS transistor MP1. Consequently, its leakage current is lessened to a low level. On the other hand, a voltage lower than ground potential GND is applied to the channel region of NMOS transistor MN1. Consequently, its leakage current is also lessened to a low level. That is, when $I_{ddq}$ test is performed in the bias state illustrated in FIG. 4, the leakage current is small for both the PMOS transistor and NMOS transistor that form logic circuit 10.

When a defect takes place in the semiconductor integrated circuit in the manufacturing process, a current higher than the leakage current of the normal transistor flows due to the defect in the circuit when a voltage is applied to the semiconductor integrated circuit under the bias condition shown in FIG. 4. That is, when the current of logic circuit 10 is measured in the bias state shown in FIG. 4 and the measurement result is compared with the normal leakage current, it is possible to detect the defect of the circuit.

In this case, for example, the circuit current is measured while power source voltage $V_{dd}$, a voltage a little lower than power source voltage $V_{dd}$ (for example, a voltage in the range of 0.8–0.9 V, supposing the power source voltage $V_{dd}$ is 1.0 V), or a voltage a little higher than the power source voltage $V_{dd}$ (for example, a voltage in the range of 1.1–1.2 V, supposing the power source voltage $V_{dd}$ is 1.0 V) is applied to the feeding terminal of power source voltage $V_{dd}$. If the measurement result is similar to the normal leakage current, it is determined that there is no defect. On the other hand, it is determined that there is a defect in logic circuit 10 if the measurement result is larger than the normal leakage current.

During said $I_{ddq}$ test, the bulk bias voltage applied to the channel region of the PMOS transistor, $V_{bp}=(V_{dd}+V_{bsp})$, and the bulk bias voltage applied to the channel region of the NMOS transistor, $V_{bn}=(GND-V_{bsn})$, can be fed from an IC tester. That is, one may have an IC tester to feed the bulk bias voltages to pads P1 and P2, respectively. Consequently, there is no need to have a dedicated generating circuit formed on the chip for generating these bulk bias voltages, such as a booster circuit. As a result, an increase in the area and power consumption of the chip can be minimized. Also, by applying power source voltage $V_{dd}$ and ground potential GND to pads P1 and P2 in operations other than the test operation, respectively, one can have the normal bias state for the channel regions of PMOS transistor and NMOS transistor.

Figure 5:
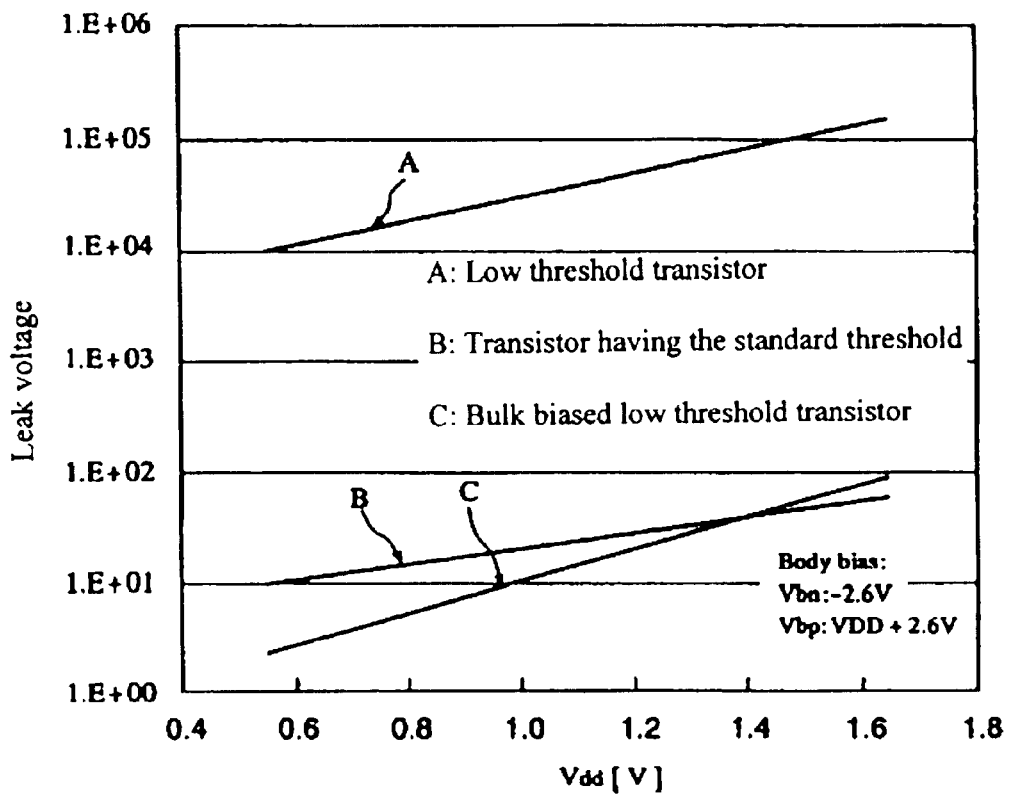
FIG. 5 is a graph illustrating the relationship between the leakage current of the transistor and the power source voltage.

FIG. 5 is a graph illustrating the relationship between the leakage current and power source voltage $V_{dd}$ of the logic circuit. This graph is prepared by plotting the results obtained in the simulation for a logic circuit made of an inverter chain composed of 20 stages of inverters connected in tandem.

In FIG. 5, line A illustrates the relationship between the leakage current of the logic circuit composed of low threshold voltage transistors and power source voltage $V_{dd}$. In this case, a normal bias voltage is applied to the channel region of the transistor. That is, the bias voltage of power source voltage $V_{dd}$ is applied to the channel region of PMOS transistor, and a bias voltage of ground potential GND is applied to the channel region of NMOS transistor.

Line B illustrates the relationship between the leakage current of the logic circuit composed of transistors having a standard threshold voltage for comparison and power source voltage $V_{dd}$.

Line C illustrates the relationship between the leakage current in the state when a bulk bias voltage for reducing the leakage current is applied to the channel region of the low threshold voltage transistor and power source voltage $V_{dd}$. Here, as the bias conditions for the transistor in the simulation, bulk bias voltage $V_{bp}$ ($=V_{dd}+2.6$ V) is applied to the channel region of the PMOS transistor, and bulk bias voltage $V_{bn}$ ($=-2.6$ V) is applied to the channel region of the NMOS transistor.

As can be seen from the figure, the leakage current of the logic circuit composed of low threshold voltage transistors is about three orders of magnitude larger than that of the logic circuit composed of transistors of the standard threshold voltage. However, by applying the aforementioned bulk bias voltage to the low threshold voltage transistors, as shown in FIG. 5, it is possible to reduce the leakage current significantly to a level similar to that of the logic circuit composed of transistors of the standard threshold voltage. In addition, in the case of a low voltage, for example, when the power source voltage $V_{dd}$ is 1.4 V or lower, the leakage current can be lessened to a low level by means of the transistors having the standard threshold voltage.

According to the results of the simulation shown in FIG. 5, in this embodiment, it is possible to significantly lower the leakage current of transistors by adopting the method of bulk bias for the low threshold voltage transistors.

In a practical semiconductor integrated circuit, transistors may have different current driving abilities even when they have the same size due to dispersion in manufacturing. Usually, it is believed that the current driving ability of transistors has a normal distribution pattern.

Figure 6:
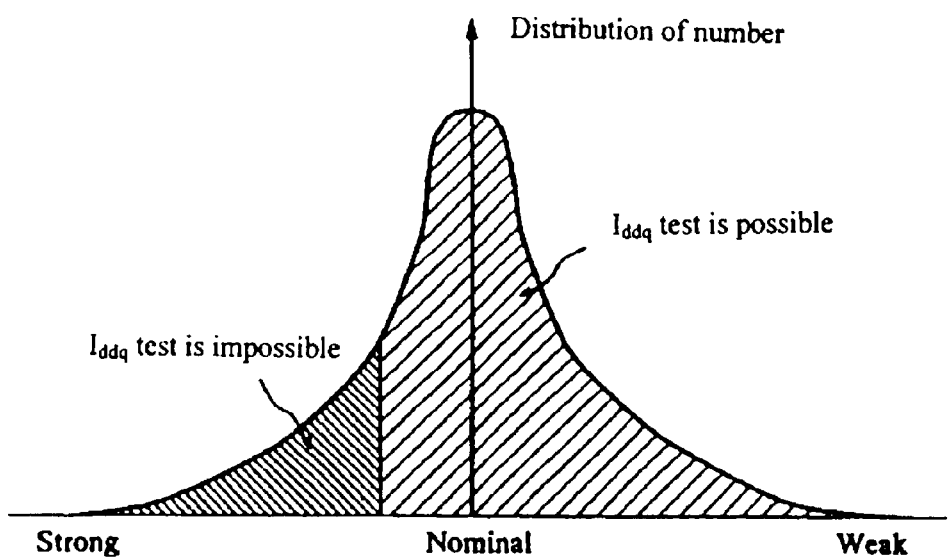
FIG. 6 is a diagram illustrating the distribution of the current driving ability of the transistors.

FIG. 6 is a graph illustrating an example of the statistical results of the distribution number according to the current driving ability. In FIG. 6, "Strong" indicates a strong current driving ability, "Normal" indicates a normal current driving ability, and "Weak" indicates a weak current driving ability. As shown in FIG. 6, most transistors have the normal current driving ability, while there are less transistors distributed to have strong or weak current driving ability.

For the transistor having a strong current driving ability, the leakage current is also large in the OFF state. Usually, the effect of reducing the leakage current by the bulk bias voltage is less significant. Consequently, when the $I_{ddq}$ test is carried out under the bulk bias condition shown in FIG. 4 for a logic circuit made of such transistor, the leakage current of the transistor is large, and it may be impossible to judge correctly whether there is a defect from the measurement results of the leakage current. In this case, a determination of defective or not may be carried out using a test method other than the $I_{ddq}$ test method. For example, it is possible to perform an accelerated test or burn-in test, in which a stress is applied, that is, a temperature or power source voltage higher than that occurring in normal operation is applied, so that the degradation of the chip of the semiconductor integrated circuit is accelerated over time.

However, although it is possible to determine correctly when the semiconductor integrated circuit is defective by means of the burn-in test, the time and cost for performing the test are increased. In particular, in the case of mass production, a measurement method with a high speed and a low cost is required, yet the burn-in test cannot meet such demand. As explained above, it is possible to determine whether there is a defect on the basis of the leakage current of the semiconductor integrated circuit by means of the $I_{ddq}$ test in this embodiment. Consequently, it is possible to shorten the checking time and to cut the cost.

As shown in FIG. 6, it is possible to detect the defect using the aforementioned $I_{ddq}$ for transistors with normal or weak current driving ability. On the other hand, for the transistors with a strong current driving ability, even in the bias state shown in FIG. 4, the leakage current is large, and it is impossible to detect the defective product solely on the basis of the measurement results of the leakage current. Consequently, it is necessary to perform the burn-in test. Also, as shown in FIG. 6, the proportion of the number of semiconductor integrated circuits that require the burn-in test is small with respect to the total number of semiconductor integrated circuits. Consequently, the burden of the test job is small.

Figure 7:
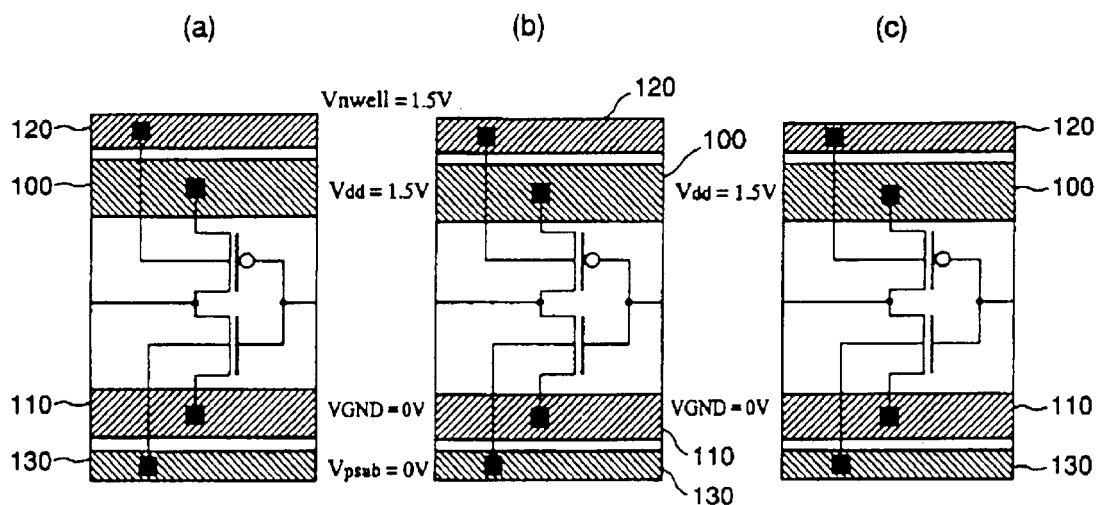
FIGS. 7(a), 7(b) and 7(c) are diagrams illustrating an example of the layout of the cell that forms the logic circuit.

FIG. 7 is a diagram illustrating an example of the layout of the basic structural unit (cell) of semiconductor integrated circuit 10 in this embodiment.

As shown in the figure, in this example, the layout of a cell composed of a CMOS inverter is shown. Wire 100 of power source voltage $V_{dd}$ and wire 120 of bulk bias voltage $V_{bp}$ are set parallel to each other. In addition, wire 110 of virtual ground potential VGND and wire 130 of bulk bias voltage $V_{bn}$ are set parallel to each other.

CMOS inverter is composed of PMOS transistor MP1 and NMOS transistor MN1. The source of transistor MP1 is connected to wire 100 of power source voltage $V_{dd}$, and its channel region is connected to wire 120 of bulk bias voltage $V_{bp}$. The source of transistor MN1 is connected to wire 110 of virtual ground potential VGND, and its channel region is connected to wire 130 of bulk bias voltage $V_{bn}$.

Also, although not shown in this figure but shown in FIG. 1, the switching transistor is connected between wire 110 of virtual ground potential VGND and the wire of the practical ground potential GND.

FIG. 7(a) illustrates the voltages applied to the various wires in the normal operation state. In this case, PMOS transistor MP1 and NMOS transistor MN1 that form the CMOS inverter cell have the normal threshold voltage, and they are used in portions of the semiconductor circuit device that is not a critical path. In the operation, power source voltage $V_{dd}$ is applied to wire 120 of bulk bias voltage $V_{bp}$, and ground potential GND is applied to wire 130 of bulk bias voltage $V_{bn}$.

FIG. 7(b) illustrates the layout of a cell composed of low threshold voltage transistors MP1 and NP1. As shown in the figure, this cell has a constitution similar to that of the cell shown in FIG. 7(a).

In this bulk bias state, the threshold voltages of transistors MP1 and MN1 are kept lower than the normal level, and high speed operation characteristics can be realized even at a low voltage. Consequently, these transistors are used in the critical path of the semiconductor circuit device.

FIG. 7(c) illustrates the voltage applied in the $I_{ddq}$ test for the CMOS inverter cell composed of low threshold voltage transistors. As shown in the figure, in the $I_{ddq}$ test, power source voltage $V_{dd}$, such as a voltage in the range of 1.0–2.0 V, is applied to wire 100, and bulk bias voltage $V_{bp}$ higher than power source voltage $V_{dd}$, such as a voltage of $V_{dd}+2.6$ V, is applied to wire 120. On the other hand, ground potential GND is applied to wire 110, and bulk bias voltage $V_{bn}$ lower than ground potential GND, such as a voltage of –2.6 V, is applied to wire 130.

In this case, the channel region of transistor MP1 is biased to a voltage higher than power source voltage $V_{dd}$, $V_{bp}$ = ($V_{dd}$+2.6 V), and the channel region of transistor MN1 is biased to a voltage lower than ground potential GND, $V_{bn}$=(–2.6 V). Consequently, although transistors MP1 and MN1 are low threshold voltage transistors, it is possible to lessen the leakage current to a level equal to or lower than that of the transistors having the standard threshold voltage. Consequently, it is possible to measure the leakage current of the logic circuit in this state, and to determine if there is a defect or not according to the measurement results.

Figure 8:
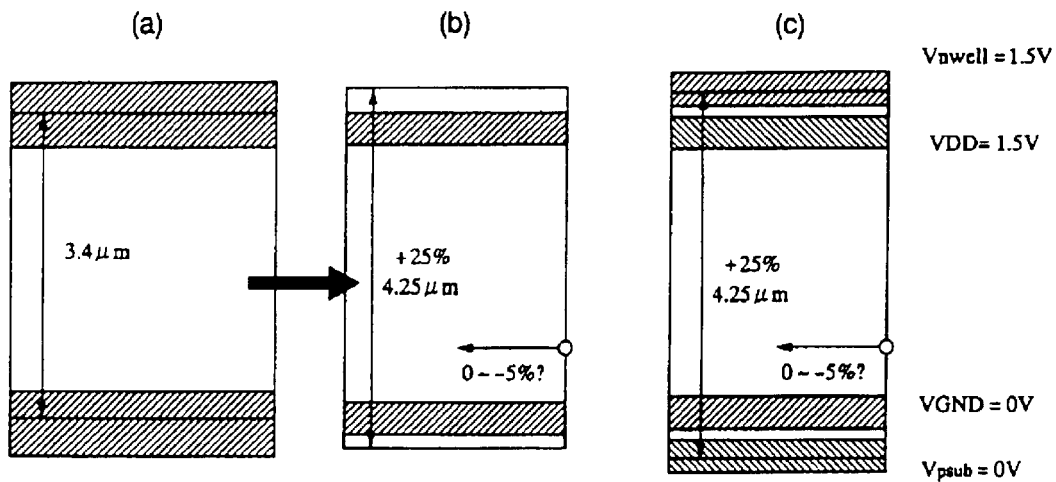
FIGS. 8(a), 8(b) and 8(c) are diagrams illustrating the layout of the ASIC cell.

FIG. 8 is a diagram illustrating the layout of the ASIC cell of the semiconductor integrated circuit.

FIG. 8(a) illustrates the layout of a conventional ASIC cell. As shown in the figure, for the conventional ASIC cell, a region of 3.4 μm is formed between wire 100 of power source voltage $V_{dd}$ and wire 110 of ground potential GND.

On the other hand, for the novel ASIC cell shown in FIG. 8(b), the length of the region that forms the cell is 4.25 μm, which is 25% larger than that of the conventional cell. However, the width is reduced by about 5%.

FIG. 8(c) illustrates the layout of the ASIC cell of the semiconductor integrated circuit of this invention. As shown in the figure, in this example, the ASIC cell is composed of low threshold voltage transistors, and it is necessary to have wiring regions for applying bulk bias voltages to the channel regions of its PMOS transistors and NMOS transistors, respectively. For this purpose, the wire of the bulk bias voltage is set parallel to the wire of power source voltage $V_{dd}$ and the wire of ground potential GND. The area of the cell is increased a little due to these wires, yet the layout area is nearly equal to that of the cell shown in FIG. 8(b).

Figure 9:
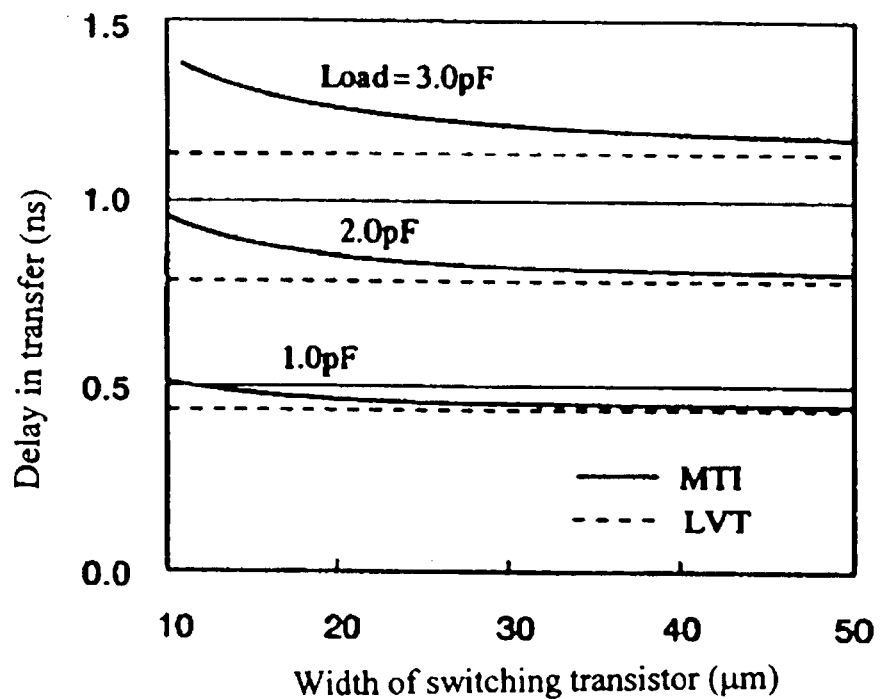
FIG. 9 is a graph illustrating the relationship between the delay time of the logic circuit and the size of the switching transistor.
Figure 10:
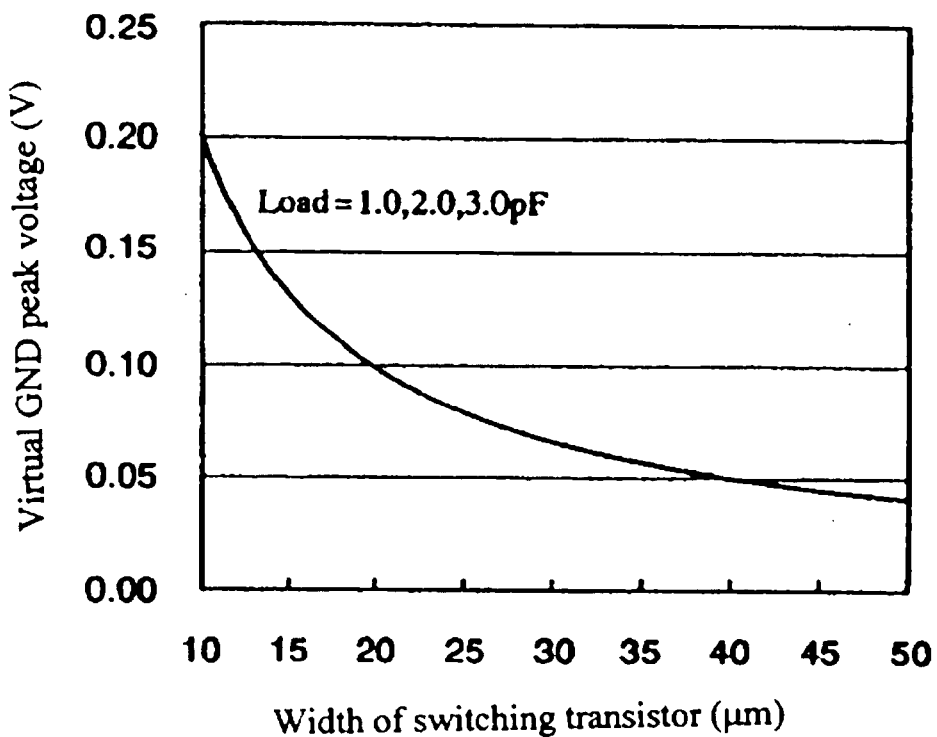
FIG. 10 is a graph illustrating the relationship between the virtual ground potential of the logic circuit and the size of the transistor for switching.

FIGS. 9 and 10 illustrate the influence of switching circuit 20 on logic circuit 10 in the semiconductor integrated circuit of this invention.

In the following, the influence of the switching circuit will be shown by simulation with the bus driver of the semiconductor integrated circuit of this embodiment taken as an example.

FIG. 9 is a graph illustrating the change in the delay time of the logic circuit (bus driver in this example) due to the switching circuit. In this figure, the ordinate represents the change in the delay time of the logic circuit with respect to channel width W of the transistor that forms the switching circuit, such as NMOS transistor MN0 shown in FIG. 1. In the figure, the solid line indicates the delay time of the bus driver composed of multi-threshold voltage transistors, and the broken line indicates the delay time of the bus driver composed of low threshold voltage transistors, not including the switching circuit (switching transistor). Also, FIG. 9 illustrates the change in the delay time for different loads of the bus driver.

As can be seen from the figure, for the multi-threshold voltage transistor, the larger the channel width W of the switching transistor, the shorter the delay time of the bus driver and the nearer the delay time to the delay time of the bus driver of the low threshold voltage transistor. This is because when channel width W of the switching transistor is increased, the ON resistance decreases in the ON state, and the smaller the influence on the delay time.

FIG. 10 is a graph illustrating the peak voltage of the virtual ground potential VGND in the bus driver of this embodiment explained above. Virtual ground potential VGND is the voltage at node N1 between logic circuit 10 and switching circuit 20 shown in FIG. 1. In operation, a driving current flows in transistor MN0 that forms switching circuit 10 and a drop in voltage takes place in its ON resistance. This drop in voltage is the voltage level of virtual voltage VGND shown in the graph of FIG. 10.

As can be seen from FIG. 10, the larger the channel width W of the switching transistor, the lower the peak voltage of VGND. When channel width W of the switching transistor is increased, its ON resistance decreases and the drop in voltage that takes place on the transistor due to the driving current in the operation becomes smaller.

SECOND EMBODIMENT

Figure 11:
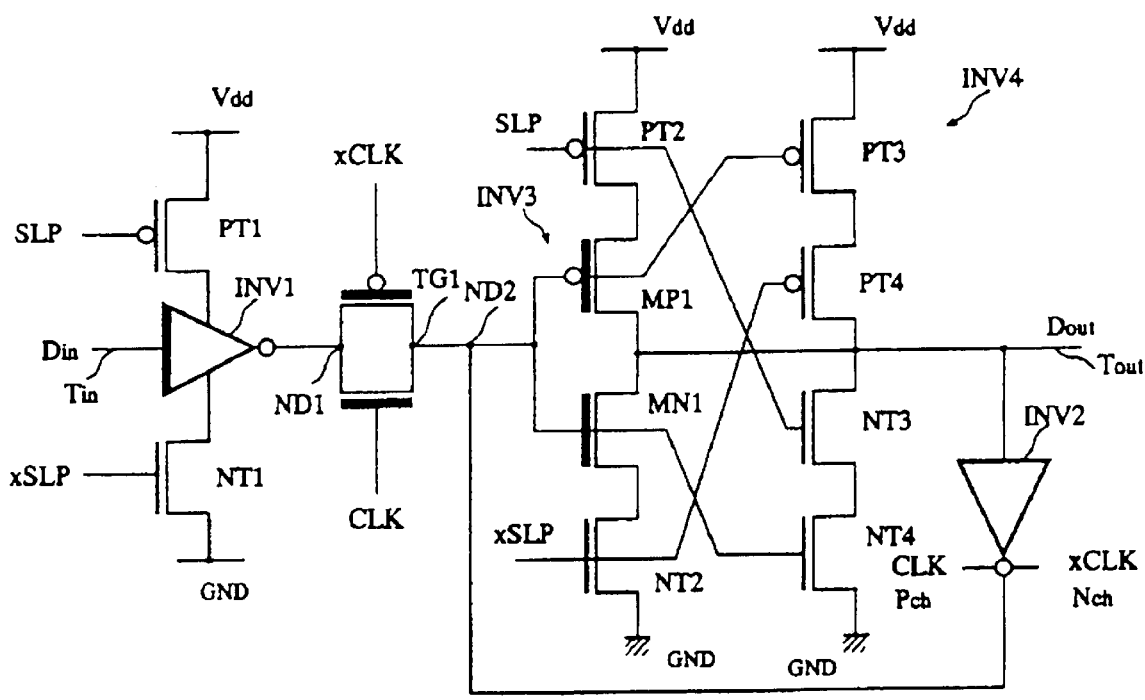
FIG. 11 is a circuit diagram illustrating the second embodiment of the semiconductor integrated circuit in this invention.

FIG. 11 is a circuit diagram illustrating the second embodiment of the semiconductor integrated circuit of this invention. The semiconductor integrated circuit in this embodiment is a latch circuit composed of low threshold voltage transistors.

As shown in the figure, this latch circuit is composed of PMOS transistors PT1, PT2, PT3, PT4, NMOS transistors NT1, NT2, NT3, NT4, low threshold voltage PMOS transistor MP1, low threshold voltage NMOS transistor MN1, inverters INV1, INV2, and transfer gate TG1.

The input terminal of inverter INV1 is connected to data input terminal $T_{in}$, and its output terminal is connected to node ND1. Also, inverter INV1 (not shown in the figure) is composed of, a low threshold voltage PMOS transistor and a low threshold voltage NMOS transistor. The source of the PMOS transistor is connected to the drain of transistor PT1, and the source of said NMOS transistor is connected to the drain of transistor NT1.

Control signal SLP is applied to the gate of transistor PT1, and inverted signal xSLP of control signal SLP is applied to the gate of transistor NT1. Consequently, transistors PT1 and NT1 act as switching transistors that feed a driving current to inverter INV1. For example, when control signal SLP is at the low level, its inverted signal xSLP is at the high level, and transistors PT1 and NT1 are ON. Consequently, a driving current is fed to inverter INV1, and inverter INV1 is kept in the operation state. In this case, the logic inverted data of data $D_{in}$ that is input to inverter INV1 is output to node ND1.

When control signal SLP is at the high level, its inverted signal xSLP is at the low level, and transistors PT1 and NT1 are OFF. Consequently, the feed path of the driving current to inverter INV1 is cut off. That is, inverter INV1 is kept in the standby state. In this case, as both switching transistors PT1 and NT1 are turned OFF, the leakage current of inverter INV1 is lessened.

As explained above, since inverter INV1 is composed of low threshold voltage transistors, a high speed data input still can be realized even at a low voltage. In addition, by connecting switching transistor PT1 between inverter INV1 and the feeding terminal of power source voltage $V_{dd}$ and connecting switching transistor NT1 between inverter INV1 and ground potential GND, it is possible to control the switching transistor to the OFF state corresponding to control signal SLP and to cut off the current feed path of inverter INV1 in the standby state, so that it is possible to lessen the generation of the leakage current in the standby state.

Transfer gate TG1 is connected between nodes ND1 and ND2. Inverted signal xCLK of clock signal CLK is applied to the gate of PMOS transistor of transfer gate TG1, and clock signal CLK is applied to the gate of the NMOS transistor. Since these PMOS transistors and NMOS transistors are made of low threshold voltage transistors, it is possible to realize a high speed transporting path of signals between node ND1 and node ND2.

PMOS transistors PT2, MP1 and NMOS transistors MN1, NT2 are connected in series between the feeding terminal of power source voltage $V_{dd}$ and ground potential GND. Control signal SLP is applied to the gate of transistor PT2, and inverted signal xSLP of control signal SLP is applied to the gate of transistor NT2.

As explained above, transistors MP1 and MN1 are low threshold voltage transistors MP. The gates of these transistors are both connected to node ND2, and their drain terminals are connected to data output terminal $T_{out}$.

That is, the inverter is composed of transistors MP1 and MN1. In FIG. 11, it is represented as inverter INV3. Since transistors MP1 and MN1 are low threshold voltage transistors, inverter INV3 can perform high speed operations even at a low voltage. In addition, transistors PT2 and NT2 act as switching transistors that control feeding of the driving current to inverter INV3. Transistors PT2 and NT2 are turned ON, a driving current is fed to inverter INV3, and inverter INV3 is kept operative when control signal SLP is at the low level. In this case, inverter INV3 outputs the logic inverted value of the data of node ND2 to output terminal $T_{out}$. On the other hand, when control signal SLP is at the high level, both transistors PT2 and NT2 are OFF. Consequently, the current feed path to inverter INV3 is cut off, and inverter INV3 is in the standby state.

PMOS transistors PT3, PT4 and NMOS transistors NT3, NT4 are connected in series between the feeding terminal of power source voltage $V_{dd}$ and ground potential GND. Both the gates of transistors PT3 and NT4 are connected to node ND2, inverted signal xSLP of control SLP is applied to the gate of transistor PT4, and control signal SLP is applied to the gate of transistor NT3.

When control signal SLP is at the high level, said connected PMOS transistors PT3, PT4 and NMOS transistors NT3, NT4 function in the same way as the inverter, and the logic inverted value of the data of node ND2 is to output terminal $T_{out}$. In FIG. 11, this partial circuit is represented as inverter INV4.

When control signal SLP is at the low level, transistors PT4 and NT3 are OFF. Consequently, inverter INV4 is kept in the standby state.

In inverter INV2, the input terminal is connected to output terminal $T_{out}$ of the latch circuit, and the output terminal is connected to node ND2. Also, as shown in the figure, inverter INV2 is the clocked inverter controlled by clock signal CLK. When clock signal CLK is at the low level, inverter INV2 becomes operative, and it forms a data latch together with said inverter INV3 or inverter INV4 to hold the data of output terminal $T_{out}$. On the other hand, when clock signal CLK is at the high level, inverter INV2 is in the standby state, and its output terminal is kept in the high impedance state. Also, since the required speed is not so high for the latch operation, inverter INV2 may be composed of transistors having standard threshold voltage.

In the following, the operation of the overall latch circuit of this embodiment will be explained with reference to FIG. 11.

In this embodiment, the latch circuit is set in either the operation state or the standby state corresponding to control signal SLP. For example, when control signal SLP is at the low level, inverters INV1 and INV3 become operative, and the latch circuit becomes operative. On the contrary, when control signal SLP is at the high level, no driving current is fed to inverters INV1 and INV3, and the latch circuit is in the standby state.

Operation State of Latch Circuit

In the operation state, at the rising edge of clock signal CLK, transfer gate TG1 is switched from the OFF state to the ON state, and the logic inverted value of input data $D_{in}$ is input through transfer gate TG1 to node ND2. In addition, in the operation state, inverter INV3 operates. Consequently, the data of node ND2 is logic inverted by inverter INV3, and the inverted data is output to output terminal $T_{out}$.

After clock signal CLK is switched to the low level, transfer gate TG1 is turned OFF, and inverter INV2 becomes operative. In this case, a data latch is formed by inverter INV3 and inverter INV3, and output data $D_{out}$ is held at output terminal $T_{out}$.

When the latch circuit becomes operative, during the period when clock signal CLK is at the high level, input data $D_{in}$ is taken into the latch circuit, and, at the falling edge of clock signal CLK, input data $D_{in}$ is sampled, and, during the period when clock signal CLK is at the low level, this data is held by the data latch composed of inverter INV2 and inverter INV3.

Standby State of Latch Circuit

In the standby state, inverter INV1 does not operate, so that even when data $D_{in}$ is input to the latch circuit, data $D_{in}$ is still not transferred to the output terminal of inverter INV1. In this case, inverter INV3 is in the standby state, while inverter INV4 becomes operative instead. Consequently, during the period when clock signal CLK is at the low level, a data latch is formed from inverters INV2 and INV4 to hold output data $D_{out}$.

As explained above, inverter INV4 is composed of transistors having the standard threshold voltage. Consequently, the leakage current of inverter INV4 is lower than that of inverter INV3. In the standby state, inverter INV3 is shut off, and inverter INV4 becomes operative, so that the power consumption in the standby state is reduced.

During the period when clock signal CLK is at the low level, inverters INV2 and INV3 form a static latch, and output data $D_{out}$ is held. On the other hand, during the period when control signal SLP is at the low level, the data is transferred by means of inverters INV1 and INV3 composed of low threshold voltage transistors. Consequently, it is possible to output the data at a high speed.

THIRD EMBODIMENT

Figure 12:
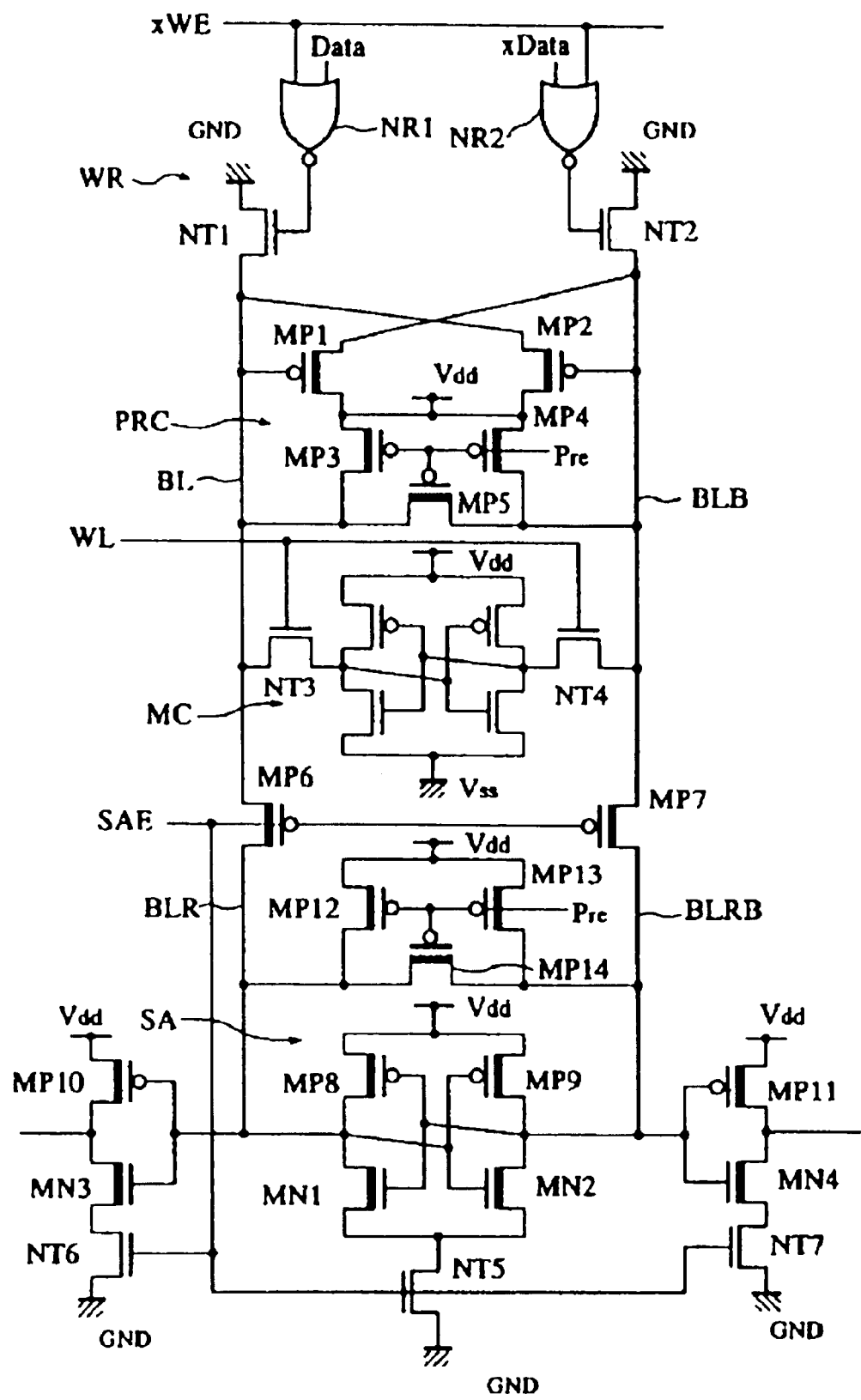
FIG. 12 is a circuit diagram illustrating the third embodiment of the semiconductor integrated circuit in this invention.

FIG. 12 is a circuit diagram illustrating the third embodiment of the semiconductor integrated circuit of this invention. The semiconductor integrated circuit in this embodiment is an SRAM composed of low threshold voltage MOS transistors.

As shown in the figure, SRAM is composed of write circuit WR, precharge circuit PRC, memory cell MC, and sense amplifier SA.

Write circuit WR is composed of NOR gates NR1, NR2 made of NMOS transistors NT1, NT2 and transistors having standard threshold voltage.

Inverted signal xWE of write enable signal WE is input to one input terminal of NOR gate NR1, while write data Data is input to the other input terminal. Inverted signal xWE of write enable signal WE is applied to one input terminal of NOR gate NR2, while the logic inverted value xData of write data Data is input to the other input terminal.

The source of transistor NT1 is connected to ground potential GND, its drain is connected to bit line BL, and its gate is connected to the output terminal of NOR gate NR1. The source of transistor NT2 is connected to ground potential GND, its drain is connected to bit building-out line BLB, and its gate is connected to the output terminal of NOR gate NR2.

During write mode, write enable signal WE is held at the high level, and its inverted signal xWE is held at the low level. Consequently, corresponding to write data Data, among NOR gates NR1 and NR2, one output is held at the high level, while the other output is held at the low level. Corresponding to this state, for transistors NT1 and NT2, one is ON, and the other is OFF. Consequently, among bit line BL and bit building-out line BLB that have been precharged to power source voltage level $V_{dd}$ by means of transistors MP3, MP4, and MP5, one is held at the high level, while the other is held at the low level. Then, word line WL is set in the active state, and access transistors NT3 and NT4 of memory cell MC are turned ON, so that the potential levels of bit line BL and bit building-out line BLB are written in memory cell MC, and write data. Data is stored in memory cell MC.

Precharge circuit PRC is composed of low threshold voltage PMOS transistors MP1, MP2, MP3, MP4, and MP5.

The source of transistor MP1 is connected to the feeding terminal of power source voltage $V_{dd}$, its drain is connected to bit building-out line BLB, and its gate is connected to bit line BL. The source of transistor MP2 is connected to the feeding terminal of power source voltage $V_{dd}$, its drain is connected to bit line BL, and its gate is connected to bit building-out line BLB.

The gates of transistors MP3, MP4, and MP5 are connected to the terminal of precharge control signal Pre. The source of transistor MP3 is connected to the feeding terminal of power source voltage $V_{dd}$, and its drain is connected to bit line BL. The source of transistor MP4 is connected to the feeding terminal of power source voltage $V_{dd}$, and its drain is connected to bit line BL. The source of transistor MP4 is connected to the feeding terminal of power source voltage $V_{dd}$, and its drain is connected to bit building-out line BLB. Also, transistor MP5 is connected between bit line BL and bit building-out line BLB.

Before read mode, precharge signal Pre is held at the low level for a prescribed period of time. Corresponding to this, transistors MP3, MP4, and MP5 are turned ON, and bit line BL and bit building-out line BLB are held at power source voltage $V_{dd}$.

Memory cell MC is a 6-transistor type SRAM composed of 6 transistors. In memory cell MC, two inverters with inputs and outputs connected alternately form a latch circuit. By means of this latch circuit, the write data is held. In the case of the read mode, word line WL is kept in the active state, such as at the level of power source voltage $V_{dd}$ or a voltage a little higher than that, ($V_{dd}+\alpha$). In this way, active transistors NT3 and NT4 of memory cell MC are turned ON, and, corresponding to the held data of memory cell MC, among bit line BL and bit building-out line BLB, one has its potential increased, while the other has its potential decreased. Consequently, a small potential difference takes place between bit line BL and bit building-out line BLB. This potential difference is amplified by sense amplifier SA. Corresponding to the result of amplification, the stored data of memory cell MC can be read.

Sense amplifier SA is composed of a precharge portion, a sense portion, and an output portion. The precharge portion is composed of PMOS transistors MP12, MP13, and MP14 having a low threshold voltage.

Corresponding to precharge signal Pre, precharge portion holds read bit line BLR and read bit building-out line BLRB at power source voltage $V_{dd}$.

The sense portion is composed of two inverters, which are made of low threshold voltage transistors MP8, MP9, MN1, and MN2, and have their inputs and outputs connected alternately. Also, switching transistor NT5 having the standard threshold voltage is connected between the side of NMOS transistor and ground potential GND of these inverters. Sense amplifier enable signal SAE is applied to the gate of transistor NT5.

The output portion is composed of an inverter made of low threshold voltage PMOS transistor MP10 and NMOS transistor MN3, and an inverter made of low threshold voltage PMOS transistor MP11 and NMOS transistor MN4. Also, switching transistor NT6 having the standard threshold voltage is connected between the source of transistor MN3 and ground potential GND, and switching transistor NT7 having the standard threshold voltage is connected between the source of transistor MN4 and ground potential GND.

As explained above, the sense portion and the output portion of the sense amplifier are composed of low threshold voltage MOS transistors. Consequently, it can guarantee high speed operation even at a low power source voltage. On the other hand, in these circuits, switching transistors are set in the driving current feed path between the inverter made of low threshold voltage transistors and ground potential GND. For example, these switching transistors are composed of NMOS transistors having the standard threshold voltage, and, in the standby mode, they hold sense enable signal SAE at the low level. Consequently, as these switching transistors are turned OFF, the path of the leakage current of the inverter made of low threshold voltage transistors is cut off, so that the generation of the leakage current can be lessened.

In the following, the write and read operation of the SRAM with the aforementioned constitution will be explained.

Write Operation

In the write mode, write enable signal WE is held at the high level, and its inverted signal xWE is held at the low level. In this case, corresponding to write data Data, the outputs of NOR gates NR1 and NR2 are determined. For example, when write data Data=1 (high level), the output of NOR gate NR1 is at the low level, and the output of NOR gate NR2 is held at the high level. Corresponding to this state, transistor NT1 is turned OFF, and transistor NT2 is turned ON. Consequently, bit building-out line BLB is held at ground potential GND. In addition, as transistor MP2, which has its gate connected to bit building-out line BLB in this case, is ON, bit line BL is held at the level of power source voltage $V_{dd}$.

When the potentials on bit line BL and bit building-out line BLB are established, word line WL is kept in the active state, and access transistors NT3 and NT4 of memory cell MC are turned ON. Consequently, corresponding to the potentials on bit line BL and bit building-out line BLB, the latch data of memory cell MC is reloaded.

After the end of write mode, word line WL is kept in a non-active state, access transistors NT3 and NT4 are turned OFF, and the write data is held by memory cell MC. Also, write enable signal WE is switched to the low level. Corresponding to this state, its inverted signal xWE is at the high level, both the outputs of NOR gates NR1 and NR2 are held at the low level, and transistors NT1 and NT2 are turned OFF.

Read Operation

In the read mode, first of all, precharge signal Pre is held at the low level. Corresponding to this state, the precharge circuit operates, and bit line BL and bit building-out line BLB are held at the level of power source voltage $V_{dd}$. Then, word line WL is held in the active state. Corresponding to this state, access transistors NT3 and NT4 are turned ON, and, corresponding to the memory data of memory cell MC, a potential difference is generated between bit line BL and bit building-out line BLB.

When word line WL is kept in the active state, sense enable signal SAE is held at the low level. Corresponding to this state, transistors MP6 and MP7 are turned ON, read bit line BLR and bit line BL are connected to each other, and read bit building-out line BLRB and bit building-out line BLB are connected to each other. The potential difference between bit line BL and bit building-out line BLB is read as it is, and it is sent to read bit line BLR and read bit building-out line BLRB.

When sense enable signal SAE is switched to the high level, transistors MP6 and MP7 are turned OFF. In this case, the sense portion operates, and the potential difference between read bit line BLR and read bit building-out line BLRB is amplified. Also, in this case, as the output portion becomes operative, the data amplified by the sense portion is output to the outside through the output portion.

As explained above, for the SRAM in this embodiment, in sense amplifier SA or other circuit, the inverter and other logic circuit are composed of low threshold voltage transistors. By means of these logic circuits, the read data is amplified and output. As the, logic circuits are composed of low threshold voltage transistors, it is possible to realize high speed read even at a low power source voltage. Also, a switching transistor is connected between the logic circuit and ground potential GND. In the operation mode, the switching transistor is turned ON, and a driving current is fed to the logic circuit. On the other hand, in the standby mode, the switching transistor is turned OFF, so that generation of the leakage current of the logic circuit can be lessened. As the memory cell portion is composed of transistors having the standard threshold voltage, the leakage current in this case becomes a very low value. Consequently, there is no need to set a switching transistor for preventing the leakage current. Also, as low threshold voltage transistors and transistors having the standard threshold voltage are set in the optimized constitution in the read path of the bit line, bit building-out line, read bit line and read bit building-out line, it is possible to realize both a low power consumption and a high speed operation.

As explained above, for the semiconductor integrated circuit in this invention, the multi-threshold voltage circuit is composed of logic circuits made of low threshold voltage transistors and a switching circuit made of transistors having the standard threshold voltage. Consequently, it is possible to realize high speed operation at a low power source voltage, and, at the same time as the switching circuit is OFF in the standby mode, the generation of the leakage current can be lessened. That is, both high speed of operation and low power consumption can be realized at the same time.

Also, according to this invention, by lessening the leakage current of the transistors, it is possible to determine whether the semiconductor integrated circuit is defective or not corresponding to the result of the $I_{ddq}$ test. It is possible to shorten the test time and to cut the test cost. These are advantages for mass production.

In addition, according to this invention, the bulk bias voltages can be fed to the PMOS transistors and NMOS transistors from the IC tester in the test. Consequently, there is no need to set a booster circuit on the chip to generate the bulk bias voltage. As a result, an increase in the chip area and power consumption can be lessened. This is an advantage.

What is claimed is:

1. A semiconductor integrated circuit comprising:

a functional circuit, which has a transistor of a first electroconductive type and a transistor of a second electroconductive type having low threshold voltages and connected between a first voltage node and a second voltage node, and which perform the prescribed signal processing with respect to the input signal, and a switching circuit, which has a transistor having a normal threshold voltage and connected between a first power source voltage feeding terminal and said first voltage node or between said second voltage node and a second power source voltage feeding terminal, and which feeds the driving current selectively with respect to said functional circuit;

means for applying, in normal operation, said first power source voltage and second power source voltage to the channel region of said transistor of the first electroconductive type and said transistor of the second electroconductive type, respectively; means for applying, in the test operation, a first bias voltage higher than the first power source voltage and a second bias voltage lower than the second power source voltage to the channel region of said transistor of the first electroconductive type and said channel region of said transistor of the second electroconductive type, respectively wherein said functional circuit and said switching circuit are formed on the principal surface of a semiconductor substrate, and the first power source voltage wiring and the wiring for the first bias voltage, as well as the second power source voltage wiring and the wiring for the second bias voltage are set parallel to each other on said semiconductor substrate.

2. The semiconductor integrated circuit described in claim 1 wherein a bias voltage application means which applies said first bias voltage and said second bias voltage or the first power source voltage and the second power source voltage on said wiring for the first bias voltage and said wiring for the second bias voltage, respectively.

3. The semiconductor integrated circuit described in claim 2 wherein the channel region of the transistor that forms said switching circuit is connected to the channel region of said transistor of the first electroconductive type or the channel region of said transistor of the second electroconductive type.

4. The semiconductor integrated circuit described in claim 2 wherein said first bias voltage and said second bias voltage are fed from an IC tester or other peripheral equipment.

5. The semiconductor integrated circuit described in claim 1 wherein the channel region of the transistor that forms said switching circuit is connected to the channel region of said transistor of the first electroconductive type or the channel region of said transistor of the second electroconductive type.

6. The semiconductor integrated circuit described in claim 1 wherein said first bias voltage and said second bias voltage are fed from an IC tester or other peripheral equipment.

7. A semiconductor integrated circuit comprising:

a functional circuit, which has a transistor of a first electroconductive-type and a transistor of a second electroconductive type having low threshold voltages and connected between a first voltage node and a second voltage node, and which perform the prescribed signal processing with respect to the input signal, and a switching circuit, which has a transistor having a normal threshold voltage and connected between a first power source voltage feeding terminal and said first voltage node or between said second voltage node and a second power source voltage feeding terminal, and which feeds the driving current selectively with respect to said functional circuit;

a circuit for applying, in normal operation, said first power source voltage and second power source voltage to the channel region of said transistor of the first electroconductive type and said transistor of the second electroconductive type, respectively; a tester for applying, in the test operation, a first bias voltage higher than the first power source voltage and a second bias voltage lower than the second power source voltage to the channel region of said transistor of the first electroconductive type and said channel region of said transistor of the second electroconductive type, respectively, wherein said functional circuit and said switching circuit are formed on the principal surface of a semiconductor substrate, and the first power source voltage wiring and the wiring for the first bias voltage, as well as the second power source voltage wiring and the wiring for the second bias voltage are set parallel to each other on said semiconductor substrate.

8. The semiconductor integrated circuit described in claim 7 wherein a bias voltage application circuit which applies said first bias voltage and said second bias voltage or the first power source voltage and the second power source voltage on said wiring for the first bias voltage and said wiring for the second bias voltage, respectively.

9. The semiconductor integrated circuit described in claim 8 wherein the channel region of the transistor that forms said switching circuit is connected to the channel region of said transistor of the first electroconductive type or the channel region of said transistor of the second electroconductive type.

10. The semiconductor integrated circuit described in claim 8 wherein said first bias voltage and said second bias voltage are fed from an IC tester or other peripheral equipment.

11. The semiconductor integrated circuit described in claim 7 wherein the channel region of the transistor that forms said switching circuit is connected to the channel region of said transistor of the first electroconductive type or the channel region of said transistor of the second electroconductive type.

12. The semiconductor integrated circuit described in claim 8 wherein said first bias voltage and said second bias voltage are fed from an external IC tester or other peripheral equipment.

* * * * *